US010707192B2

(12) United States Patent
Jingi

(10) Patent No.: US 10,707,192 B2
(45) Date of Patent: Jul. 7, 2020

(54) LIGHT EMITTING PANEL COMPRISING A PLURALITY OF LIGHT EMITTING MODULES

(71) Applicant: TOSHIBA HOKUTO ELECTRONICS CORPORATION, Asahikawa-Shi (JP)

(72) Inventor: Tomotsugu Jingi, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 16/121,930

(22) Filed: Sep. 5, 2018

(65) Prior Publication Data

US 2019/0081026 A1    Mar. 14, 2019

(30) Foreign Application Priority Data

Sep. 11, 2017   (JP) .................. 2017-174029

(51) Int. Cl.
*H01L 25/075* (2006.01)
*G09F 9/33* (2006.01)
*H01L 33/62* (2010.01)

(52) U.S. Cl.
CPC ............ *H01L 25/0756* (2013.01); *G09F 9/33* (2013.01); *H01L 25/0753* (2013.01); *H01L 33/62* (2013.01)

(58) Field of Classification Search
CPC combination set(s) only.
See application file for complete search history.

(56) References Cited

U.S. PATENT DOCUMENTS

| 7,695,158 B2 * | 4/2010 | Kawabe .................... G09F 9/33 362/212 |
| 9,306,132 B2 | 4/2016 | Maki |
| 9,627,594 B2 | 4/2017 | Maki |
| 9,837,587 B2 | 12/2017 | Maki |
| 2005/0073471 A1 * | 4/2005 | Selbrede ............... G02F 1/1347 345/4 |
| 2005/0214963 A1 * | 9/2005 | Daniels ................... H01L 24/29 438/29 |
| 2009/0114928 A1 * | 5/2009 | Messere ............ B32B 17/10559 257/88 |

(Continued)

FOREIGN PATENT DOCUMENTS

| JP | 2012-084855 A1 | 4/2012 |
| JP | 2015-029130 A1 | 2/2015 |

(Continued)

OTHER PUBLICATIONS

U.S. Appl. No. 16/531,402, filed Aug. 5, 2019, Jingi, Tomotsugu.

*Primary Examiner* — Nduka E Ojeh
(74) *Attorney, Agent, or Firm* — Burr & Brown, PLLC

(57) ABSTRACT

A light emitting panel according to this embodiment includes a plurality of light emitting modules, and the plurality of light emitting modules each include: a first insulation film that is light transmissive; a second insulation film which is disposed so as to face the first insulation film, and which is light transmissive; a conductive layer formed on at least either one of the first insulation film or the second insulation film; and a plurality of light emitting elements which is disposed between the first insulation film and the second insulation film, is disposed so as to form a predetermined pattern, and is connected to the conductive layer.

20 Claims, 20 Drawing Sheets

(56) References Cited

U.S. PATENT DOCUMENTS

| | | | |
|---|---|---|---|
| 2011/0186876 A1* | 8/2011 | Suzuki | B41J 2/45 |
| | | | 257/89 |
| 2014/0110726 A1* | 4/2014 | Naijo | H01L 51/52 |
| | | | 257/88 |
| 2016/0013376 A1* | 1/2016 | Maki | H01L 25/0753 |
| | | | 257/88 |
| 2016/0027973 A1* | 1/2016 | Maki | H01L 33/62 |
| | | | 257/99 |
| 2016/0069523 A1* | 3/2016 | Chien | H05B 33/08 |
| | | | 362/97.1 |
| 2016/0155913 A1 | 6/2016 | Maki | |
| 2017/0270896 A1* | 9/2017 | Cope | G09G 5/10 |
| 2018/0076364 A1 | 3/2018 | Maki | |

FOREIGN PATENT DOCUMENTS

| | | |
|---|---|---|
| JP | 2015-073103 A1 | 4/2015 |
| JP | 2016-157979 A1 | 9/2016 |
| JP | 2016-184772 A1 | 10/2016 |

* cited by examiner

LIGHT EMITTING PANEL COMPRISING A PLURALITY OF LIGHT EMITTING MODULES

CROSS REFERENCE TO RELATED APPLICATIONS

This application is based upon and claims the benefit of priority from the prior Japanese Patent Application No. 2017-174029 filed in Japan on Sep. 11, 2017; the entire contents of which are incorporated herein by reference.

FIELD

Embodiments of the present disclosure relates to a light emitting panel.

BACKGROUND

In recent years, reduction of an energy consumption amount is becoming important. In view of such a background, Light Emitting Diodes (LEDs) that have relatively little power consumption are getting attention as a next-generation light source. LEDs are small, have a little heat generation amount, and have an excellent response. Hence, LEDs are widely applied for various optical apparatuses. For example, in recent years, a module that has a light source which is LEDs disposed on a flexible and light transmissive substrate has been proposed.

It is difficult to densely dispose LEDs in comparison with pixels of a liquid crystal, etc. Moreover, when the LEDs are disposed on a light transmissive substrate, a constraint for wiring increases. Accordingly, in order to express various patterns using LEDs mounted on a light transmissive substrate, a devisal is necessary.

DETAILED DESCRIPTION

In order to achieve the above objective, a light emitting panel according to an embodiment includes a plurality of light emitting modules, and the plurality of light emitting modules each include:
a first insulation film that is light transmissive;
a second insulation film which is disposed so as to face the first insulation film, and which is light transmissive;
a conductive layer formed on at least either one of the first insulation film or the second insulation film; and
a plurality of light emitting elements which is disposed between the first insulation film and the second insulation film, is disposed so as to form a predetermined pattern, and is connected to the conductive layer.

An embodiment of the present disclosure will be described below with reference to figures. An XYZ coordinate system that have the X-axis, the Y-axis, and the Z-axis orthogonal to each other is applied for the following description.

Figure 1:
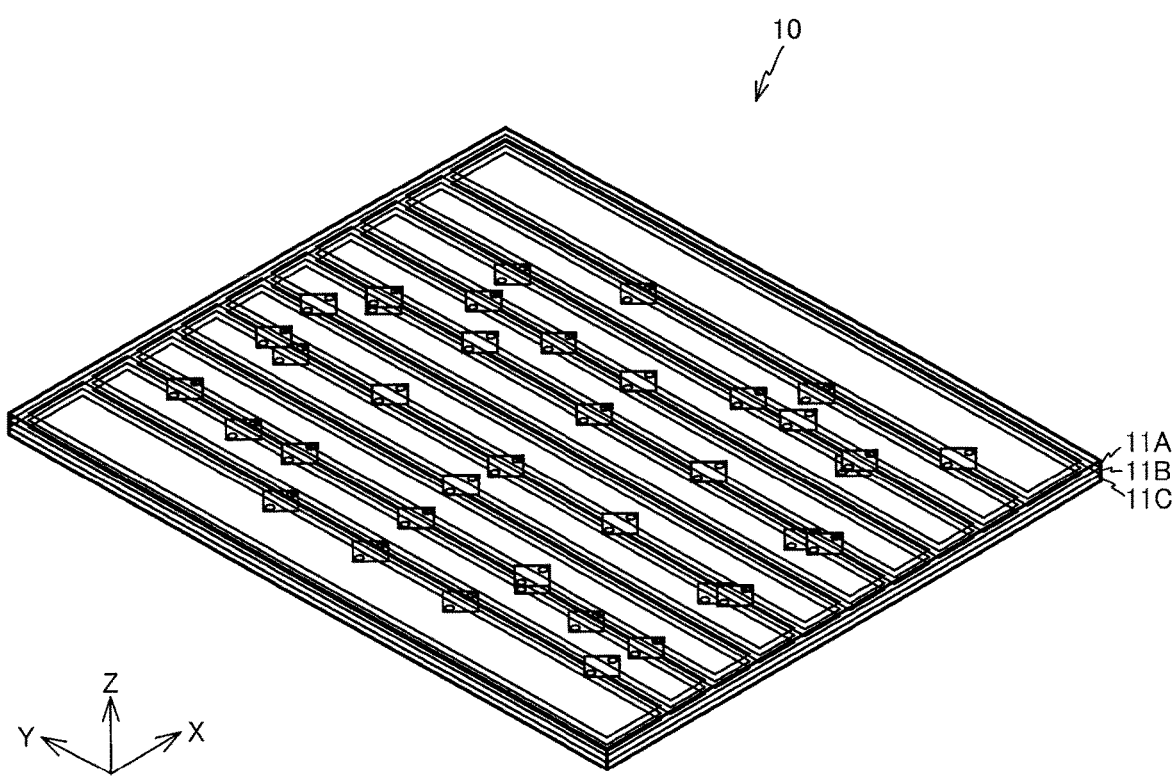
FIG. 1 is a plan view of a light emitting panel according to an embodiment.

FIG. 1 is a plan view of a light emitting panel 10 according to this embodiment. As illustrated in FIG. 1, the light emitting panel 10 is a rectangular panel that has a lengthwise direction parallel to Y-axis direction. The light emitting panel 10 is flexible and light transmissive.

Figure 2:
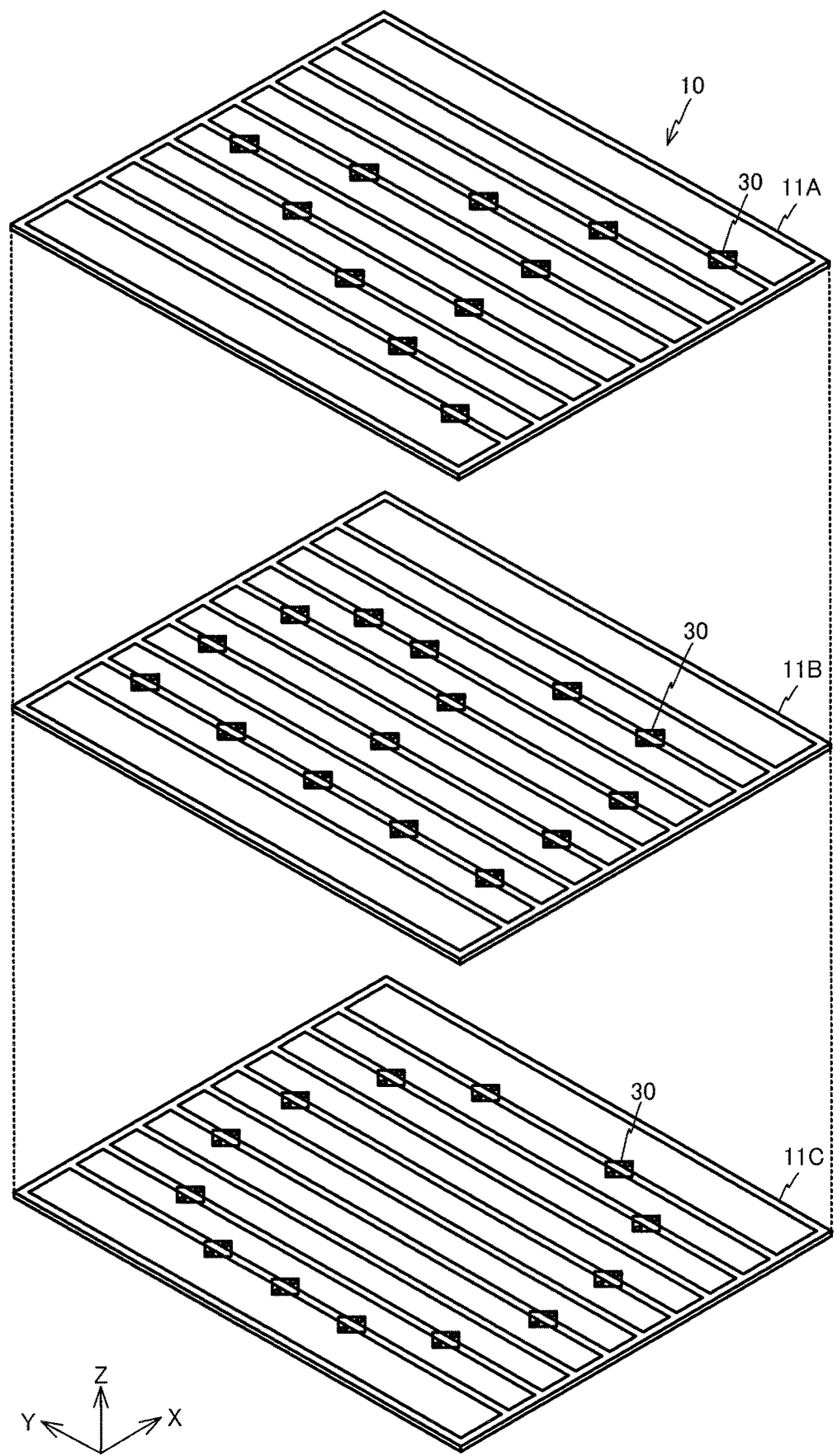
FIG. 2 is an exploded perspective view of the light emitting panel.

FIG. 2 is an exploded perspective view of the light emitting panel 10. As illustrated in FIG. 2, the light emitting panel 10 includes, for example, three light emitting modules 11A, 11B, and 11C. Although the light emitting modules 11A, 11B, and 11C have the similar structure to each other, have different disposition patterns of the light emitting element 30.

Figure 3:
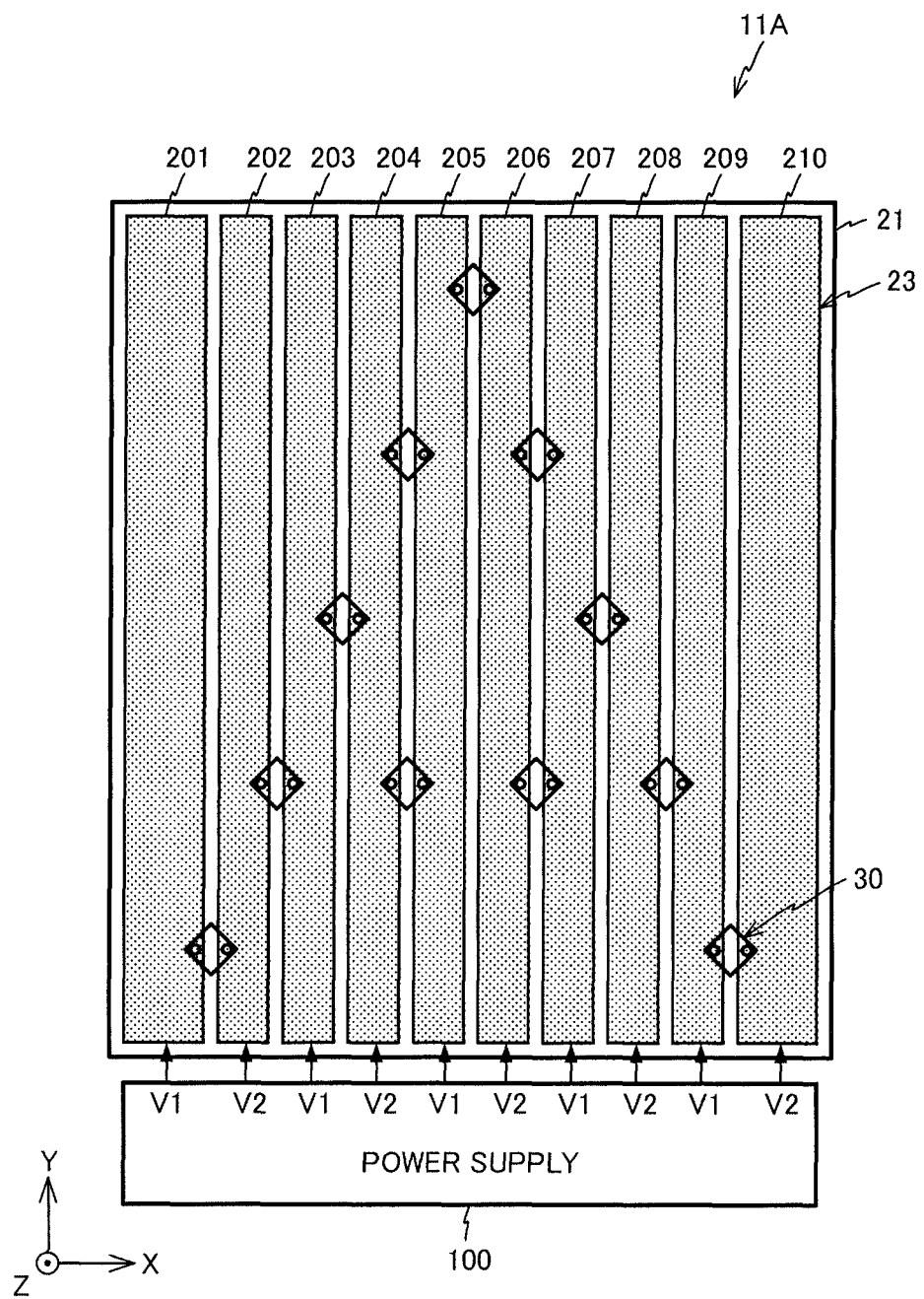
FIG. 3 is a plan view of a light emitting module.

FIG. 3 is a plan view of the light emitting module 11A. In the light emitting module 11A, the light emitting elements 30 are disposed so as to form a display pattern that indicates a letter "A". Although the display pattern may be formed by the equal to or greater than 12 light emitting elements 30 in practice, in this example, for the purpose of description, the display pattern is formed by the 11 light emitting elements 30.

Figure 4:
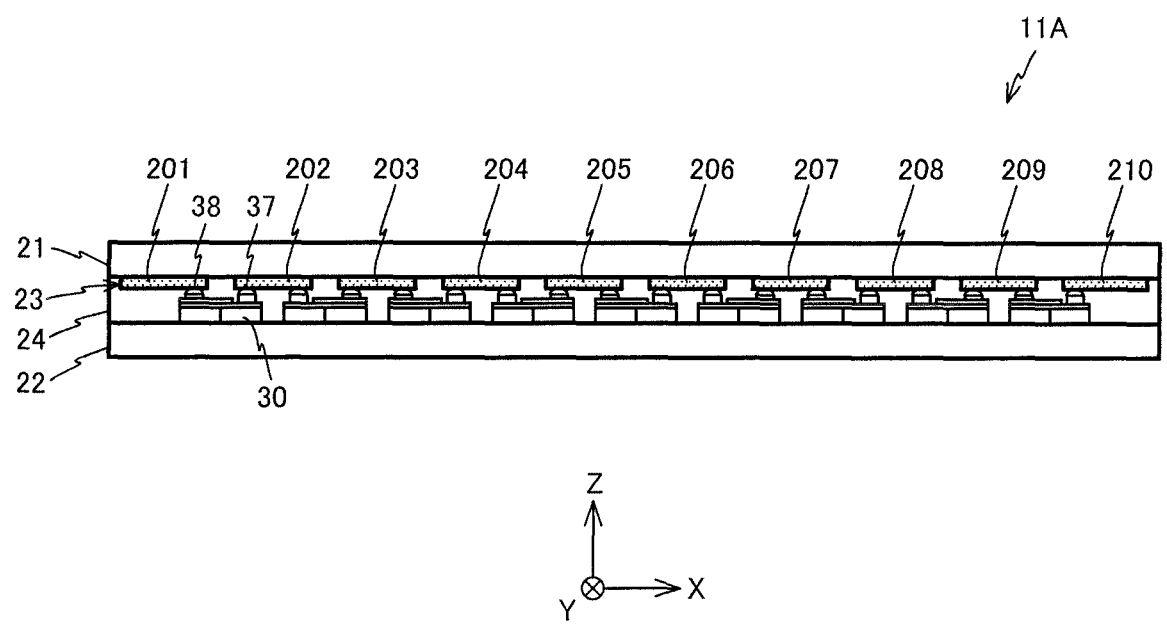
FIG. 4 is a side view of the light emitting module.

FIG. 4 is a side view illustrating an XZ plane of the light emitting module 11A. As illustrated in FIG. 4, the light emitting panel 10 includes a pair of light transmissive films 21, 22, a resin layer 24 formed between the light transmissive films 21, 22, and the multiple light emitting elements 30 disposed in the resin layer 24.

The light transmissive films 21, 22 are each a rectangular film that has a lengthwise direction parallel to the Y-axis direction. The light transmissive films 21, 22 each have a thickness of substantially 50-300 µm, and are light transmissive with respect to visible lights. It is preferable that the total light transmittance of the light transmissive films 21 and 22 should be substantially 5-95%. The term total light transmittance is the total optical transmittance measured in compliance with Japanese Industrial Standards JISK7375: 2008.

The light transmissive films 21 and 22 are each flexible, and have the bending elastic modulus of substantially 0-320 kgf/mm² (other than zero). The term bending elastic modulus is a value measured by the method in compliance with ISO178 (JISK7171:2008).

Example materials of the light transmissive films 21 and 22 are polyethylene terephthalate (PET), polyethylene naphthalate (PEN), polycarbonate (PC), polyethylene succinate (PES), arton (ARTON), and an acrylic resin.

A conductive layer 23 that has a thickness of substantially 0.05-10 μm is formed on the lower surface (a surface at the −Z side in FIG. 4) of the light transmissive film 21 in the pair of light transmissive films 21 and 22. The conductive layer 23 is, for example, a plating film, a vapor deposition film, or a sputtering film, etc. Moreover, the conductive layer 23 may be a metallic film pasted by an adhesive. When the conductive layers 23 is a vapor deposition film or a sputtering film, the thickness of the conductive layer 23 is substantially 0.05-2 μm. When the conductive layer 23 is a metallic film, the thickness of the conductive layer 23 is substantially 2-10 μm or substantially 2-7 μm.

As illustrated in FIG. 3, the conductive layer 23 is formed by rectangular mesh patterns 201 to 210 that have respective lengthwise directions parallel to the Y-axis direction. Each of the mesh patterns 201 to 210 is formed of a metallic material, such as copper (Cu) or silver (Ag).

Figure 5:
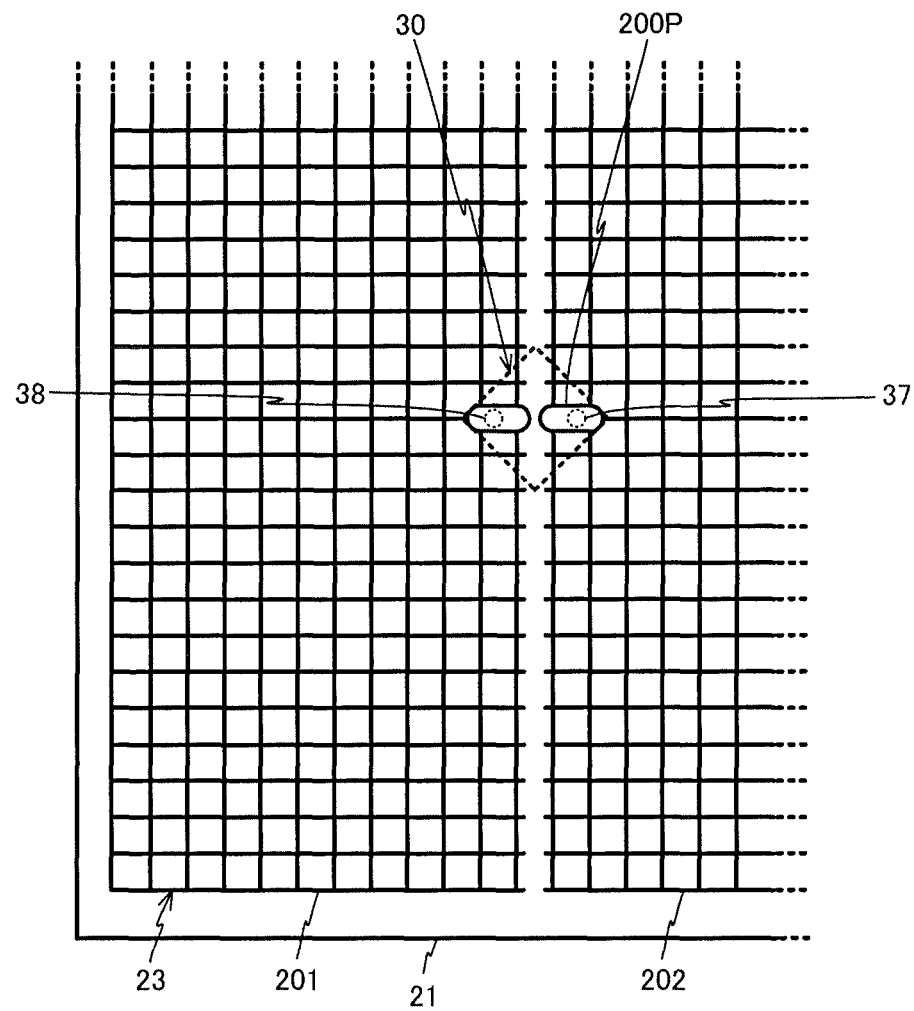
FIG. 5 is a partial enlarged diagram of a mesh pattern.

FIG. 5 is a partial enlarged view of the mesh patterns 201, 202. As is clear from FIG. 5, the mesh patterns 201 to 210 are each formed of line patterns which have a line width of substantially 10 μm. The line patterns parallel to the X-axis direction are formed at the pitch of substantially 300 μm along the Y-axis direction. Moreover, the line patterns parallel to the Y-axis direction are formed at the pitch of substantially 300 μm along the X-axis direction. A connection pad 200P to be connected to the electrode of the light emitting element 30 is formed for each of the mesh patterns 201 to 210.

As illustrated in FIG. 4, the resin layer 24 is formed between the light transmissive films 21, 22. The resin layer 24 is light transmissive with respect to visible light.

The light emitting element 30 is a square LED chip that has a side of substantially 0.1-3 mm. The light emitting element 30 is, for example, a bare chip.

Figure 6:
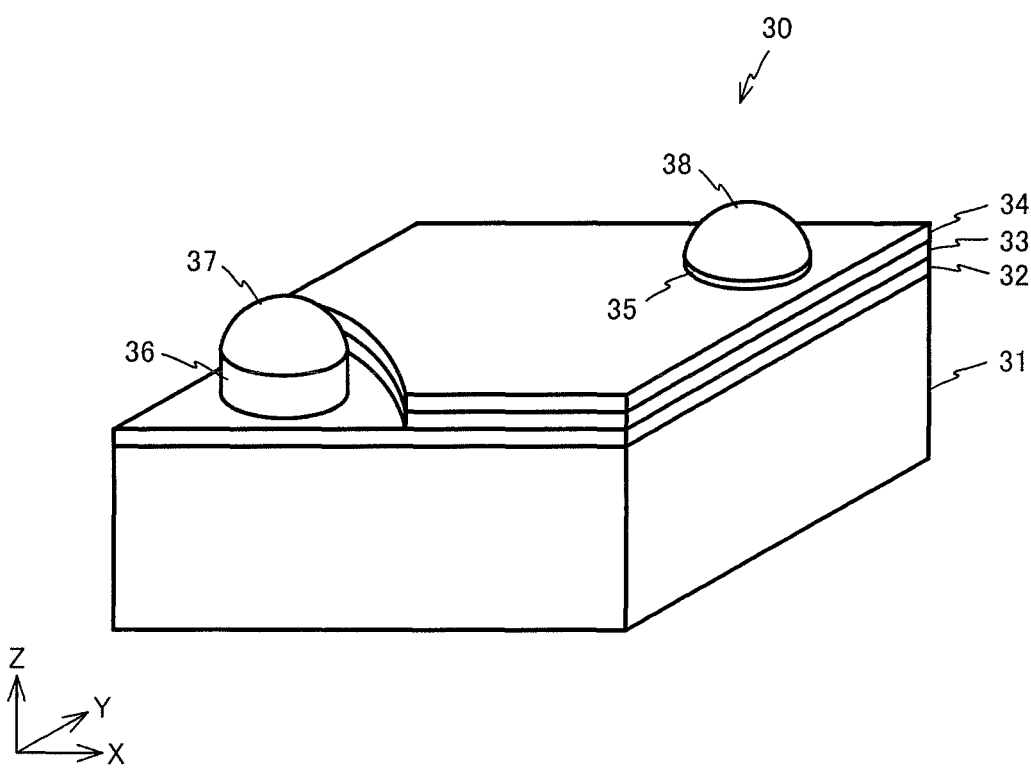
FIG. 6 is a perspective view illustrating a light emitting element.

FIG. 6 is a perspective view of the light emitting element 30. As illustrated in FIG. 6, the light emitting element 30 is an LED chip that includes a base substrate 31, an N-type semiconductor layer 32, an active layer 33, and a P-type semiconductor layer 34. The rated voltage of the light emitting element 30 is substantially 2.5 V.

The base substrate 31 is a substrate in a square plate shape formed of, for example, sapphire. The N-type semiconductor layer 32 in the same shape as that of the base substrate 31 is formed on the upper surface of the base substrate 31. Moreover, the active layer 33 and the P-type semiconductor layer 34 are laminated on the upper surface of the N-type semiconductor layer 32 in this sequence. The N-type semiconductor layer 32, the active layer 33, and the P-type semiconductor layer 34 are formed of a compound semiconductor material. In the case of, for example, the light emitting element that emits red light, an InAlGaP-based semiconductor is applicable to the active layer. Moreover, in the cases of the light emitting elements that emit blue and green lights, a GaN-based semiconductor and an InGaN-based semiconductor are applicable to the P-type semiconductor layer 34 and the N-type semiconductor layer 32, and to the active layer 33, respectively. In any cases, the active layer may employ a double-hetero (DH) junction structure, or may employ a multiplex-quantum-well (MQW) structure. Moreover, the PN junction structure may be employed.

The active layer 33 and the P-type semiconductor layer 34 laminated on the N-type semiconductor layer 32 have a notch formed at the −X-side and also −Y-side corner. The surface of the N-type semiconductor layer 32 is exposed from the notch of the active layer 33 and the P-type semiconductor layer 34.

A pad 36 electrically connected to the N-type semiconductor layer 32 is formed in the region of the N-type semiconductor layer 32 exposed from the active layer 33 and the P-type semiconductor layer 34. Moreover, a pad 35 electrically connected to the P-type semiconductor layer 34 is formed at the corner portion of the P-type semiconductor layer 34 at the +X side and also the +Y side. The pads 35 and 36 are each formed of copper (Cu) or gold (Au), and bumps 37 and 38 are formed on the respective upper surfaces. The bumps 37 and 38 are metal bumps, such as gold (Au) or a gold alloy. A solder bump formed in a semi-spherical shape may be applied instead of the metal bump. According to the light emitting element 30, the bump 37 serves as a cathode electrode while the bump 38 serves as an anode electrode.

As is clear from FIG. 5, the light emitting element 30 is disposed across the two mesh patterns by connecting the bumps 37, 38 to the connection pad 200P formed in the mesh patterns 201 to 210.

According to the light emitting module 11A, as illustrated in FIG. 3, the light emitting element 30 is caused to emit light by applying different voltages V1, V2 to the adjacent mesh patterns 201 to 210 using a power supply 100.

Figure 7:
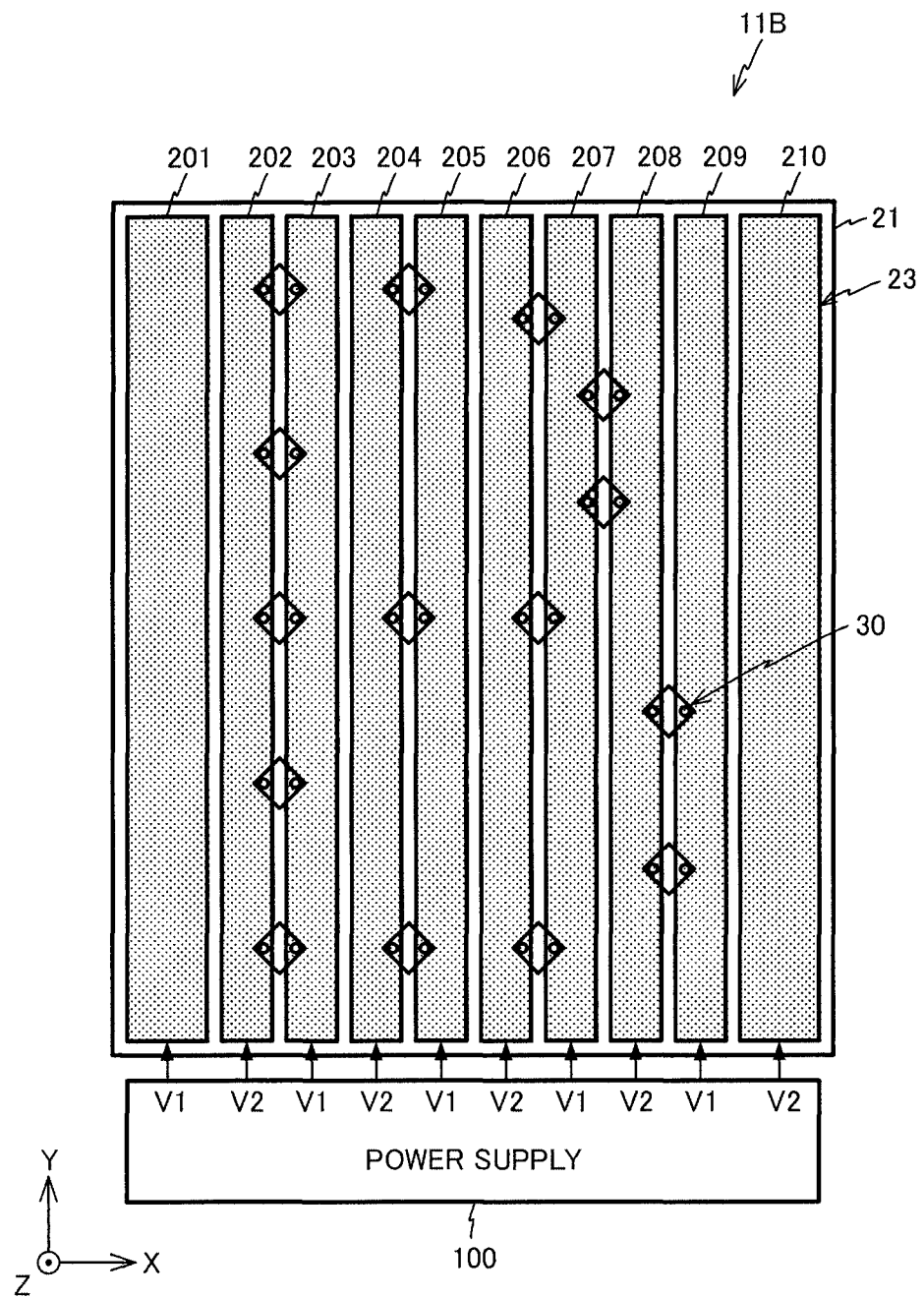
FIG. 7 is a plan view of the light emitting module.
Figure 8:
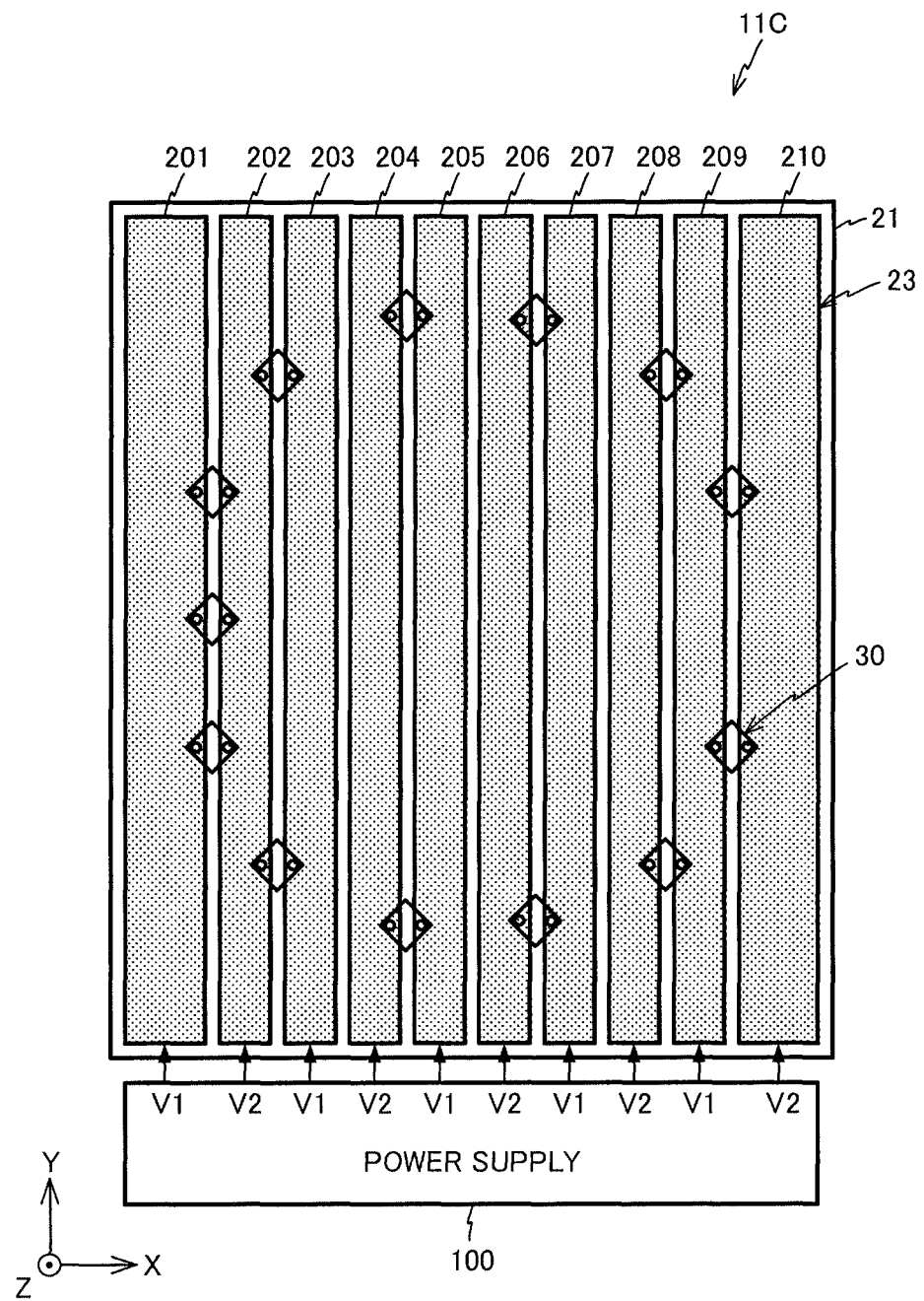
FIG. 8 is a plan view of the light emitting module.

FIG. 7 is a plan view of the light emitting module 11B. Moreover, FIG. 8 is a plan view of the light emitting module 11C. As illustrated in FIG. 7 and FIG. 8, the light emitting modules 11B and 11C are also formed like the light emitting module 11A. Moreover, according to the light emitting module 11B, the 15 light emitting elements 30 form a display pattern that indicates a letter "B". Furthermore, according to the light emitting module 11C, the 13 light emitting elements 30 form a display pattern that indicates a letter "C".

As is clear from FIG. 2, the light emitting panel 10 is formed by pasting together the light emitting modules 11A to 11C that employ the above described structure using, for example, a transparent adhesive.

Figure 9:
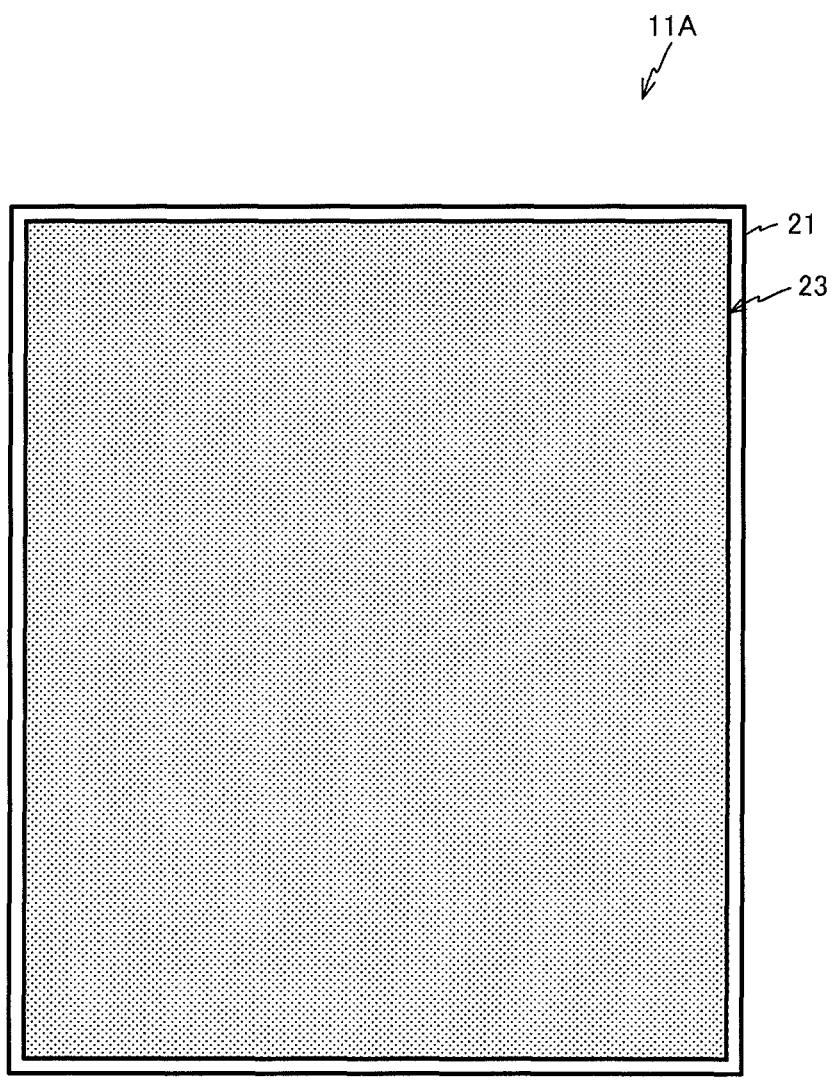
FIG. 9 is a diagram for describing a manufacturing procedure of the light emitting panel.
Figure 10:
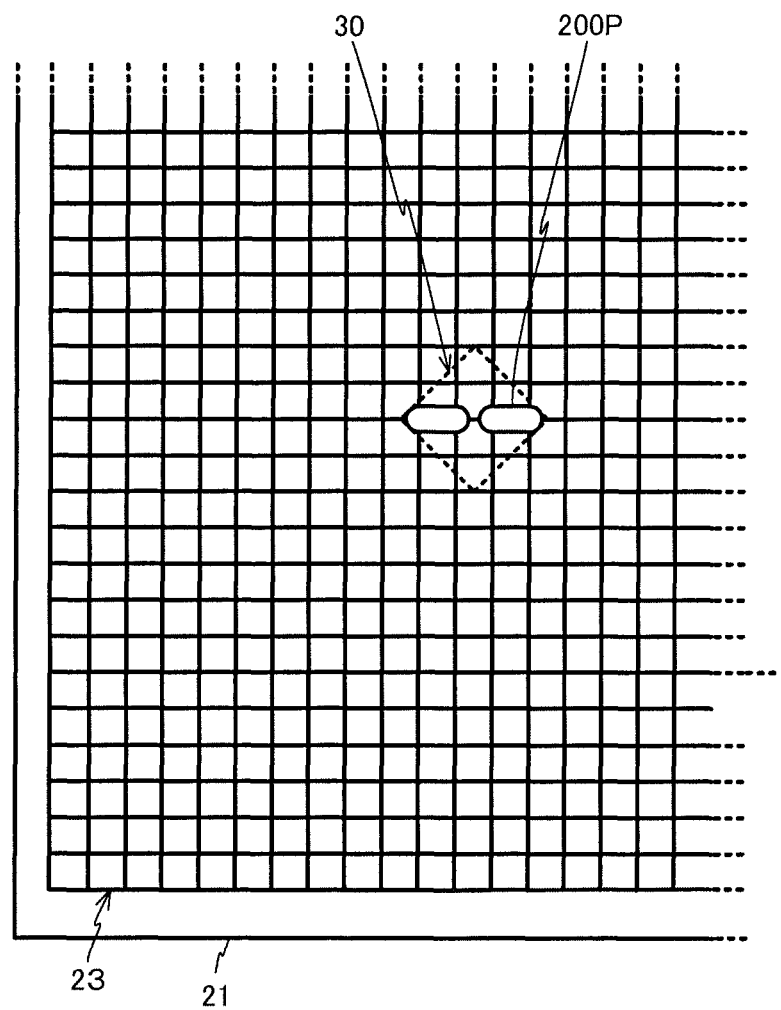
FIG. 10 is a diagram for describing the manufacturing procedure of the light emitting panel.

Next, a manufacturing method of the above light emitting panel 10 will be described. First, in order to manufacture the light emitting module 11A that forms the light emitting panel 10, the light transmissive film 21 formed of PET is prepared. Next, as illustrated in FIG. 9, the conductive layer 23 in a mesh shape is formed on the entire surface of the light transmissive film 21 by a subtraction scheme or an additive scheme. FIG. 10 is a partially enlarged view of the conductive layer 23. As illustrated in FIG. 10, in the conductive layer 23 in this case, portions to be the mesh patterns 201 to 210 are formed integrally. Moreover, the connection pad 200P is formed on the conductive layer 23 at the location where the light emitting element 30 is mounted.

Next, the mesh patterns 201 to 210 are formed by cutting the conductive layer 23 using energy beams like laser lights. The cutting of the conductive layer 23 is carried out by emitting laser lights to the conductive layer 23 formed on the surface of the light transmissive film 21, and moving the laser spot of laser lights along the dashed line illustrated in FIG. 11. Hence, the conductive layer 23 is cut along the dashed lines, and as illustrated in FIG. 12, the rectangular mesh patterns 201 to 210 are formed.

Figure 11:
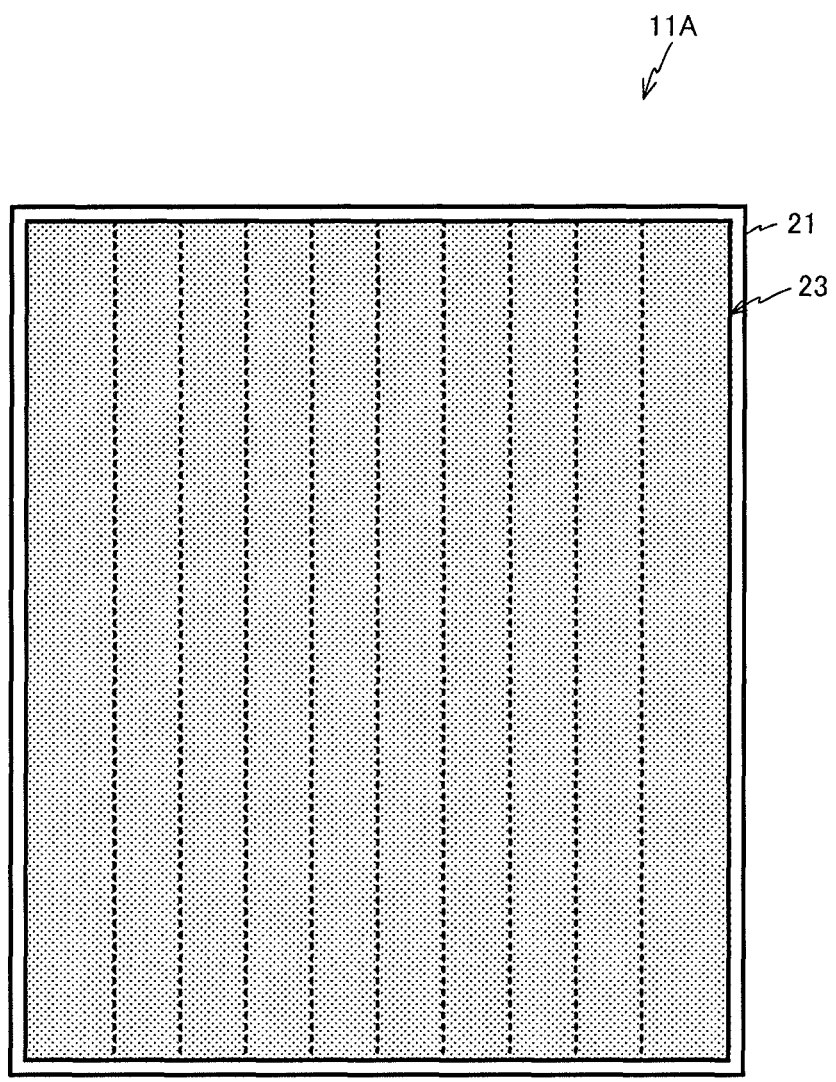
FIG. 11 is a diagram for describing the manufacturing procedure of the light emitting panel.
Figure 12:
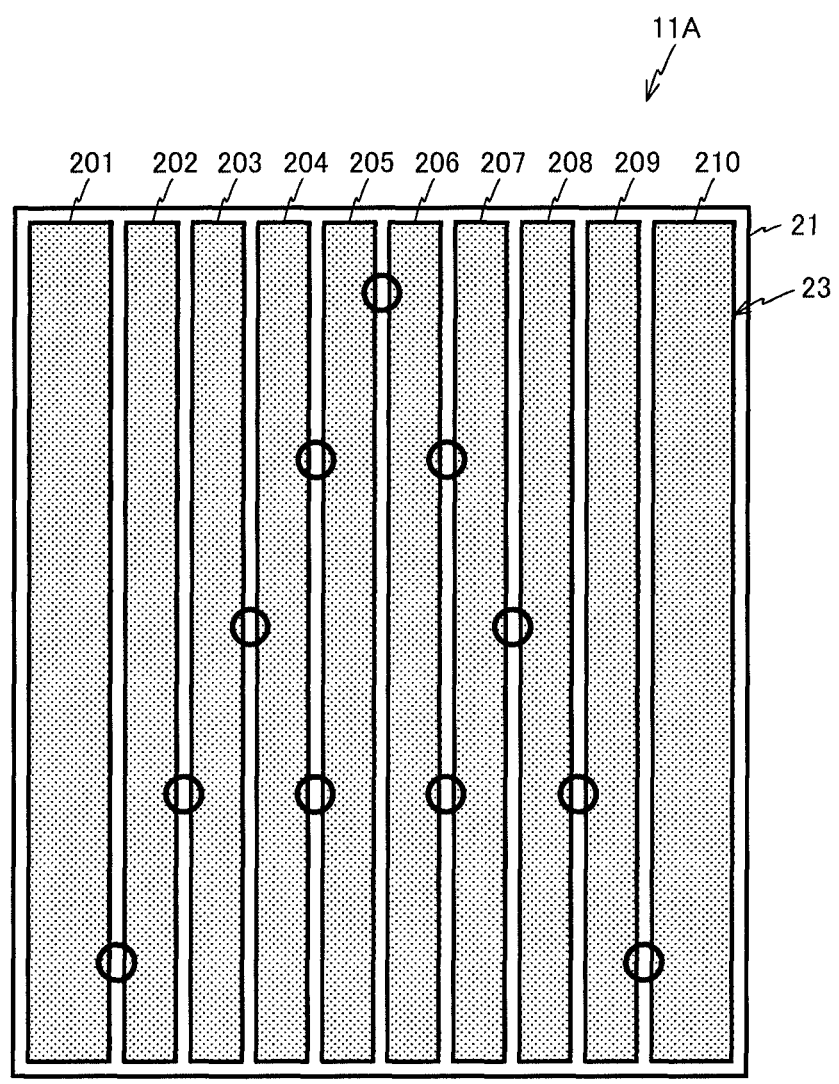
FIG. 12 is a diagram for describing the manufacturing procedure of the light emitting panel.

When the laser spot of laser lights moves along the dashed line illustrated in FIG. 11 on the surface of the conductive layer 23, a portion near the moving path of the laser spot is melted and sublimated. Hence, as illustrated in FIG. 5, the mesh patterns 201 to 210 are cut out, and connection pads 200P formed adjacent to each other are electrically separated from each other. According to the light emitting module 11A, the pair of connection pads 200P is formed at the location indicated by each circle in FIG. 12.

Figure 13:
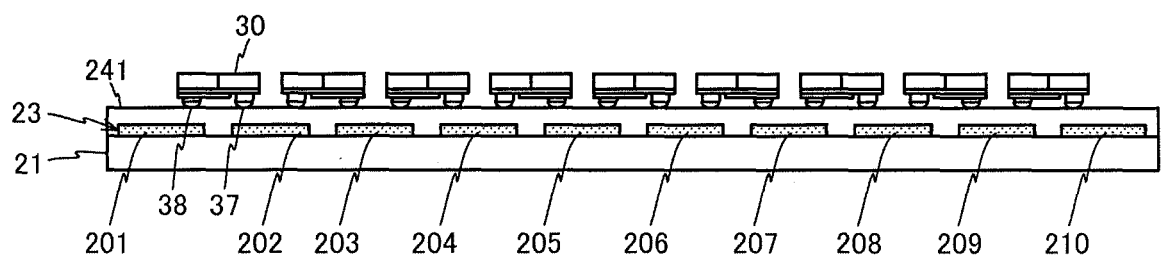
FIG. 13 is a diagram for describing the manufacturing procedure of the light emitting panel.

Next, as illustrated in FIG. 13, a thermosetting resin 241 is formed on the surface of the light transmissive film 21 on which the mesh patterns 201 to 210 have been formed. The thickness of this thermosetting resin 241 is substantially equal to the height of the bumps 37, 38 of the light emitting element 30. In this embodiment, the thermosetting resin 241 is a resin film, and is disposed on the surface of the light transmissive film 21. An example material of the thermosetting resin 241 is an epoxy-based resin.

Subsequently, the light emitting elements 30 are disposed on the thermosetting resin 241. At this time, the light emitting element 30 is positioned in such a way that the corresponding connection pads 200P formed on the mesh patterns 201 to 210 are located right below the bumps 37, 38 of the light emitting element 30.

Figure 14:
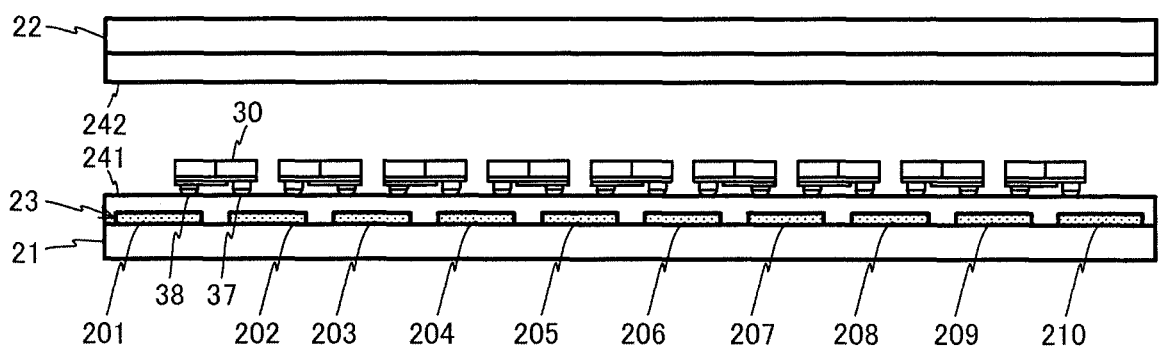
FIG. 14 is a diagram for describing the manufacturing procedure of the light emitting panel.

Next, as illustrated in FIG. 14, the light transmissive film 22 having the lower surface on which the film that is a thermoplastic resin 242 has been pasted is disposed at the upper-surface side of the light transmissive film 21. An example material of the thermoplastic resin 242 is an acryl-based elastomer.

Next, the light transmissive films 21, 22 are each heated and press-fitted with each other under a vacuum atmosphere. Hence, the bumps 37, 38 formed on the light emitting element 30 first pass completely through the thermosetting resin 241, reach the conductive layer 23, and are electrically connected to the respective mesh patterns 201 to 210. Moreover, the softened thermoplastic resin 242 by heating is filled around the light emitting element 30 without a void, and the thermosetting resin 241 is cured. Accordingly, the thermosetting resin 241 and the thermoplastic resin 242 become the resin layer 24 that holds the light emitting element 30 between the light transmissive films 21, 22 as illustrated in FIG. 4. The light emitting module 11A is fabricated through the above processes.

Next, the light emitting modules 11B and 11C are manufactured through the similar procedures to the manufacturing of the light emitting module 11A. Subsequently, by bonding the light emitting modules 11A, 11B and 11C, as illustrated in FIG. 1, the light emitting panel 10 is fabricated.

According to the light emitting panel 10 that employs the above structure, by applying a potential difference among the mesh patterns 201 to 210 that form the respective light emitting modules 11A, 11B, and 11C, the respective light emitting modules 11A, 11B, and 11C emit light.

The light emitting modules 11A to 11C that form the light emitting panel 10 are each light transmissive. Accordingly, the letter "A" can be expressed by causing the light emitting elements 30 of the light emitting module 11A to emit light in the light emitting panel 10. Moreover, by causing the light emitting elements 30 of the light emitting module 11B to emit light, the letter "B" can be expressed, and the letter "C" can be expressed by causing the light emitting elements 30 of the light emitting module 11C to emit light.

As described above, the light emitting panel 10 according to this embodiment is formed by laminating the light emitting modules 11A to 11C that are each light transmissive. Hence, by having different disposition pattern of the light emitting elements 30 of the respective light emitting modules 11A to 11C from one another, multiple display patterns can be displayed using the light emitting panel 10.

According to the light emitting panel 10 of this embodiment, the light emitting elements 30 are connected by the mesh patterns 201 to 210. These mesh patterns 201 to 210 are each formed of a metal thin film that has a line width of substantially 10 μm. This allows the light emitting modules 11A to 11C to be sufficiently transparent and flexible, and thus the transparency of the light emitting panel 10 and the flexibility thereof can sufficiently secured. This enables the light emitting panel 10 to be utilized in a curved condition.

According to the light emitting panel 10 that employs the above structure, the display variation of the issue panel 10 can be increased by connecting the respective light emitting modules 11A to 11C to the power supply 100 capable of causing the light emitting modules to emit light at different intensities from each other.

First Modified Example

In the above embodiment, the description has been given of an example case in which the light emitting panel 10 includes the three light emitting modules 11A to 11C. The present disclosure is not limited to this case, and the light emitting panel 10 may include equal to or greater than two or four light emitting modules. Moreover, the colors of the light emitted by the light emitting elements 30 of the respective light emitting modules 11A to 11C may differ from each other among the light emitting modules 11A to 11C.

Second Modified Example

Figure 15:
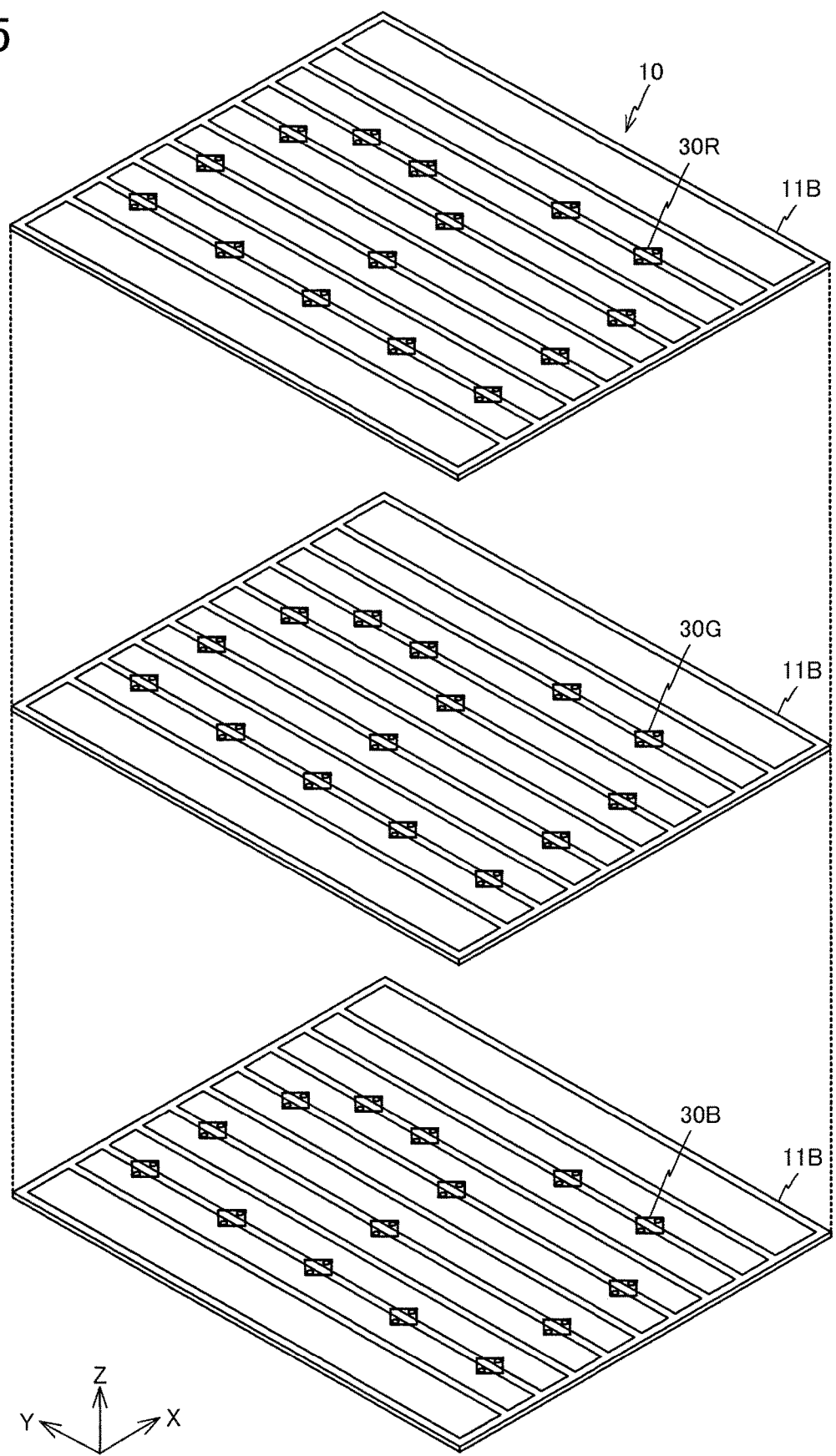
FIG. 15 is an exploded perspective view of a light emitting panel according to a modified example.

In the above embodiment, the description has been given of an example case in which the light emitting modules 11A to 11C of the light emitting panel 10 form the different display patterns. The present disclosure is not limited to this case, and for example, as illustrated in FIG. 15, the light emitting panel 10 may include the light emitting modules that have the consistent display pattern with each other. In this case, for example, the display pattern of the first light emitting module may be formed by light emitting elements 30R that emit red light, the display pattern of the second light emitting module may be formed by light emitting elements 30G that emit green light, and the display pattern of the third light emitting module may be formed by light emitting elements 30B that emit blue light. The light emitting element 30R emits light with a peak wavelength of substantially 600 to 700 nm. Moreover, the light emitting element 30G emits light with a peak wavelength of substantially 500 to 550 nm. The light emitting element 30B emits light with a peak wavelength of substantially 450 to 500 nm. By employing such a structure, the display pattern of the light emitting panel 10 can be displayed with colors, such as intermediate color and while color other than red, green and blue.

Third Modified Example

Figure 16:
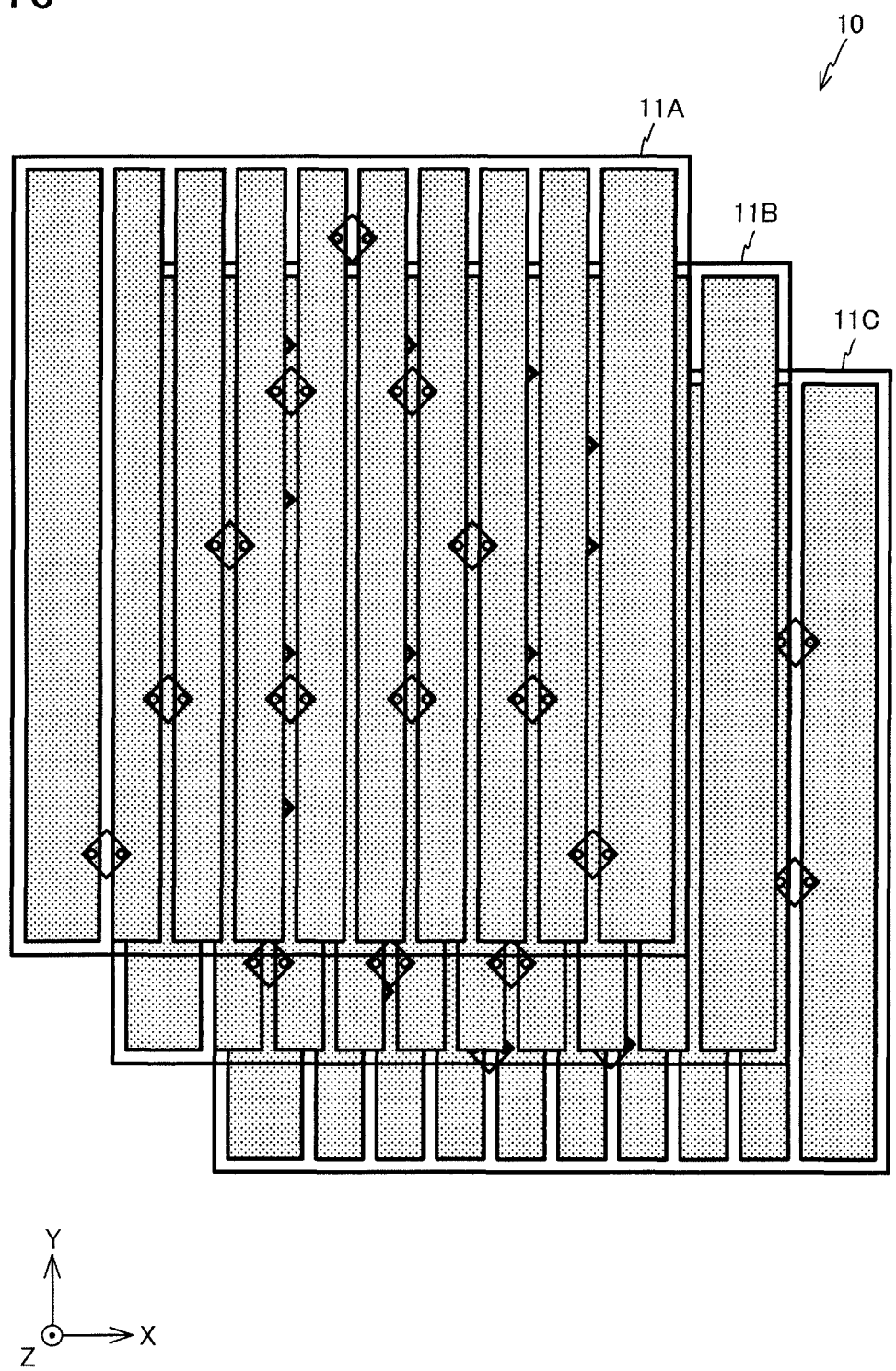
FIG. 16 is a plan view of the light emitting panel according to the modified example.

In the above embodiment, the description has been given of an example case in which the light emitting modules 11A to 11C are completely overlapped. The present disclosure is not limited to this case, and as illustrated in FIG. 16, the light emitting modules 11A to 11C may be overlapped with an offset in the X-axis direction or in the Y-axis direction.

Fourth Modified Example

Figure 17:
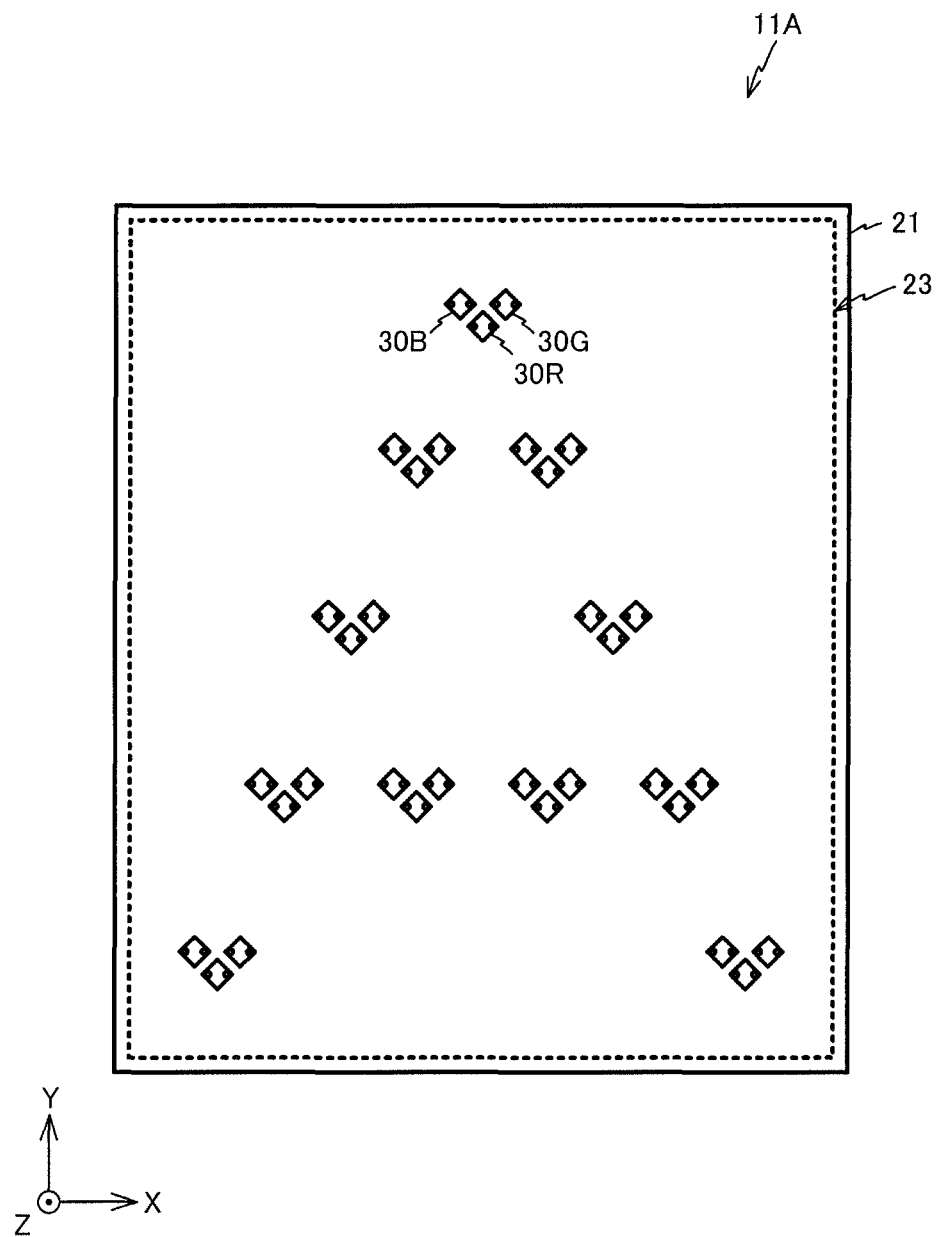
FIG. 17 is a plan view of the light emitting module according to the modified example.
Figure 18:
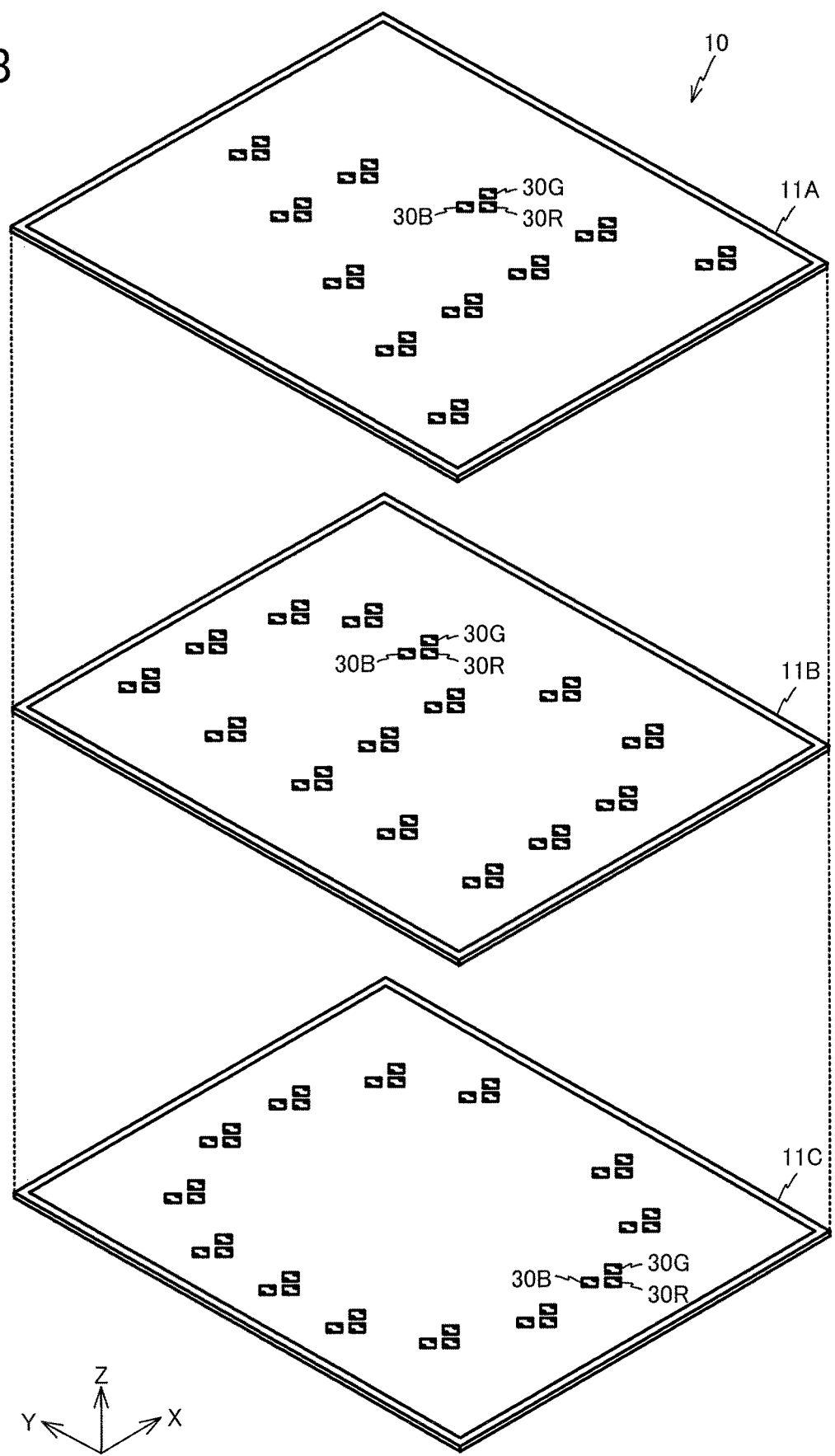
FIG. 18 is an exploded perspective view of the light emitting panel according to the modified example.

In the above embodiment, as illustrated in, for example, FIG. 2, the respective light emitting elements 30 are disposed with a distance from each other. The present disclosure is not limited to this case, and as illustrated in, for example, FIG. 17, the light emitting element 30R that emits red light, the light emitting element 30G that emits green light, and the light emitting element 30B that emits blue light may be disposed adjacent to each other, and a set of light emitting elements 30R, 30G, and 30B may function as a bright dot. By laminating the light emitting modules 11A, 11B, and 11C having the respective light emitting elements 30R, 30G and 30B disposed as described above as illustrated in FIG. 18 so as to form the light emitting panel 10, the respective display patterns of the light emitting modules 11A, 11B and 11C can be displayed by colors, such as intermediate color and white color. In this case, however, the mesh patterns that form the conductive layer 23 is formed so as to enable an individual drive for the light emitting elements 30R, 30G and 30B of the respective light emitting modules 11A, 11B and 11C. This achieves the light emitting panel 10 capable of displaying various display patterns.

Moreover, according to this modified example, the set of light emitting elements 30R, 30G, and 30B that forms a bright dot is disposed in the same plane (XY plane). This achieves the thin light emitting panel 10 in comparison with a case in which the set of light emitting elements 30R, 30G, and 30B that forms a bright dot is disposed in the Z-axis direction.

In this case, also, the respective display patterns of the light emitting modules 11A to 11C may be consistent with each other or different from each other.

Fifth Modified Example

Figure 19:
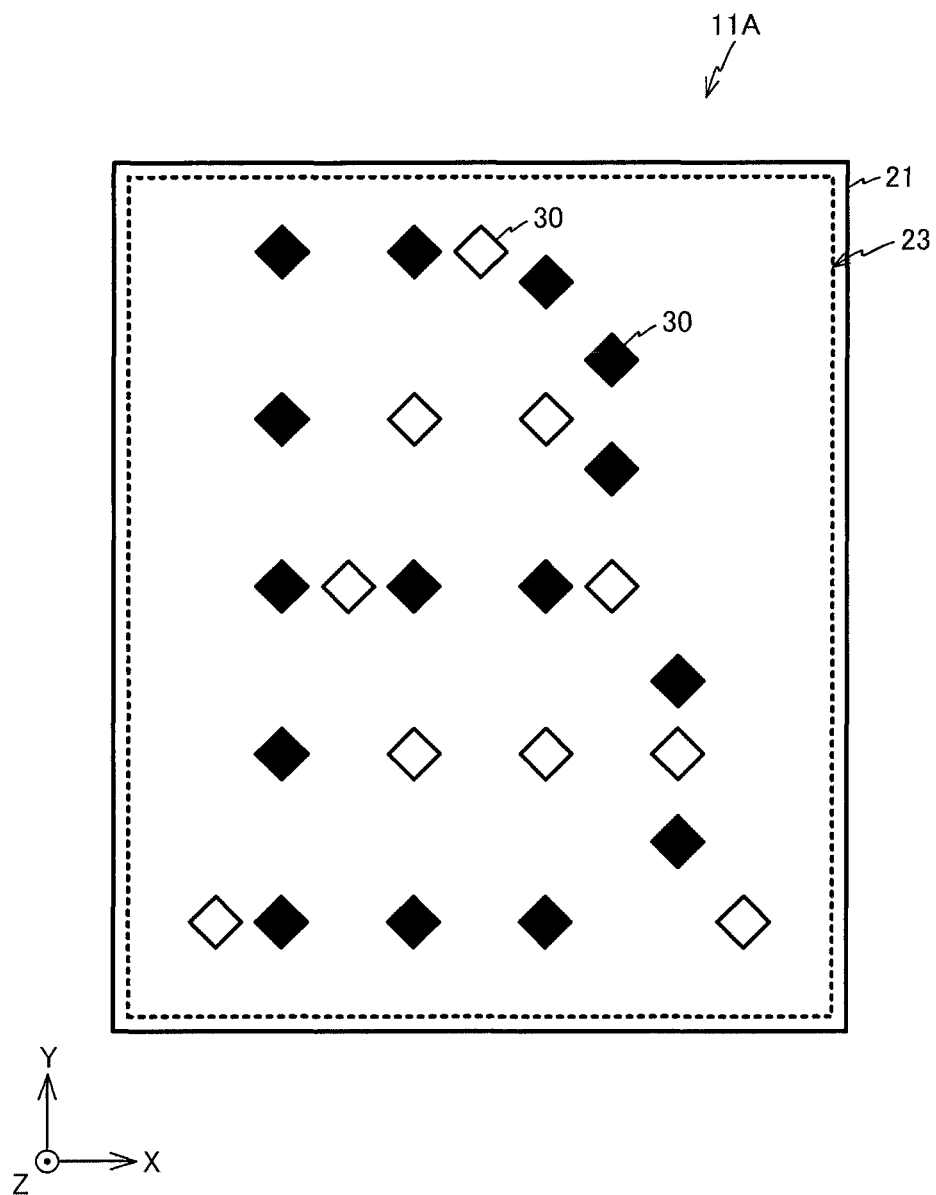
FIG. 19 is a plan view of the light emitting panel according to the modified example.

In the above embodiment, the description has been given of an example case in which each of the light emitting modules 11A to 11C has the single pattern. The present disclosure is not limited to this case, and for example, as illustrated in FIG. 19, the light emitting module 11A may be provided with a display pattern formed by the light emitting modules 30 indicated by white squares, and a display pattern formed by the light emitting modules 30 indicated by black squares. In this case, the mesh patterns that form the conductive layer 23 are formed so as to enable an individual drive for the light emitting elements 30 indicated by the white squares and for the light emitting elements 30 indicated by the black squares. Moreover, the light emitting module 11A may be provided with equal to or greater than three display patterns. This enables an entire thinning of the light emitting panel 10.

Sixth Modified Example

Figure 20:
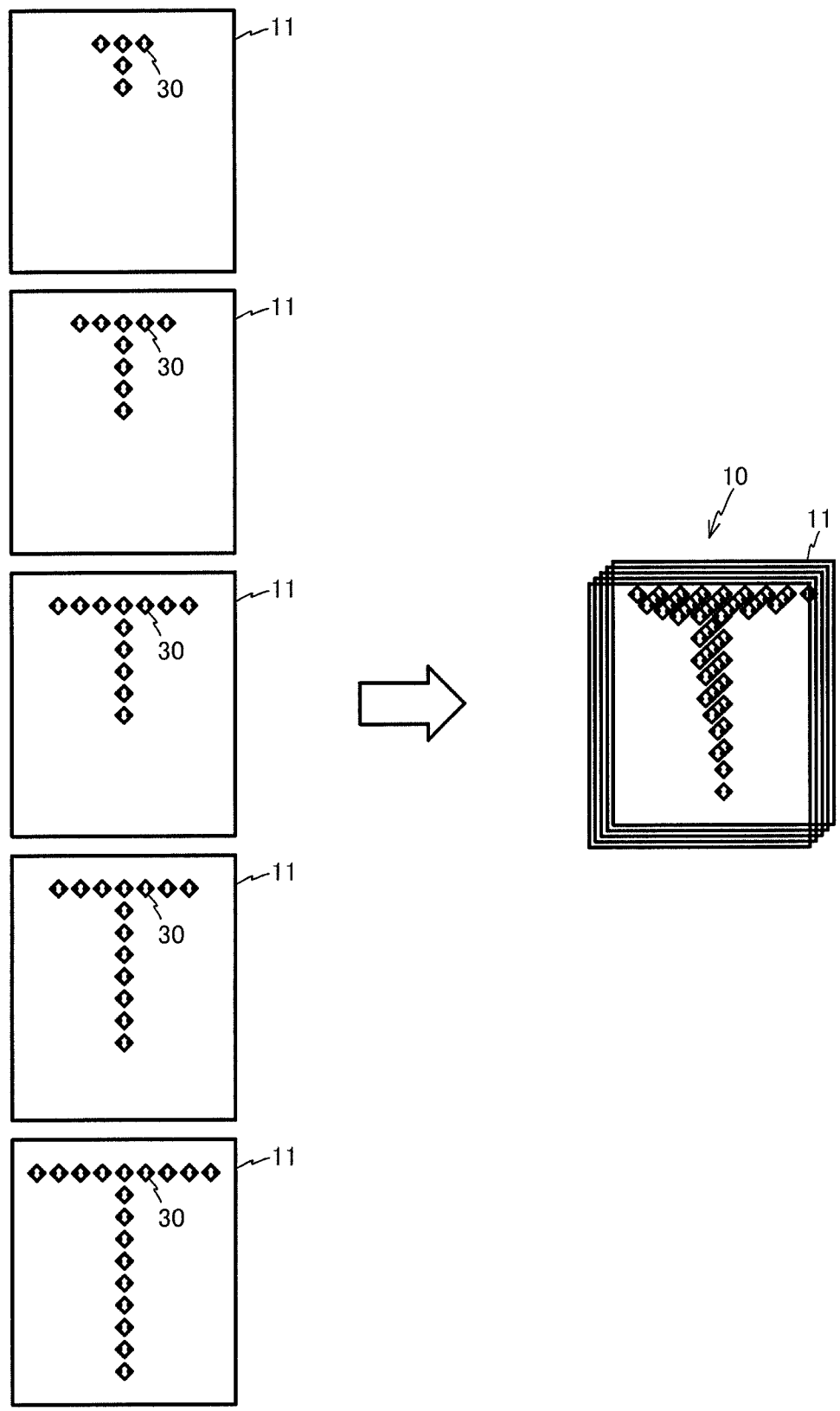
FIG. 20 is a diagram for describing the light emitting panel according to the modified example.

In the above embodiment, the description has been given of an example case in which the light emitting panel 10 is formed by bonding the three light emitting modules 11A to 11C. The present disclosure is not limited to this case, and for example, as illustrated in FIG. 20, the multiple light emitting modules 11 with different scales of the display pattern formed by the light emitting elements 30 may be laminated to form the light emitting panel 10. Moreover, the light emitting modules 11 do not need to be intimately in contact with each other, and may be overlapped with a predetermined clearance. This achieves a stereoscopic display pattern.

Figure 21:
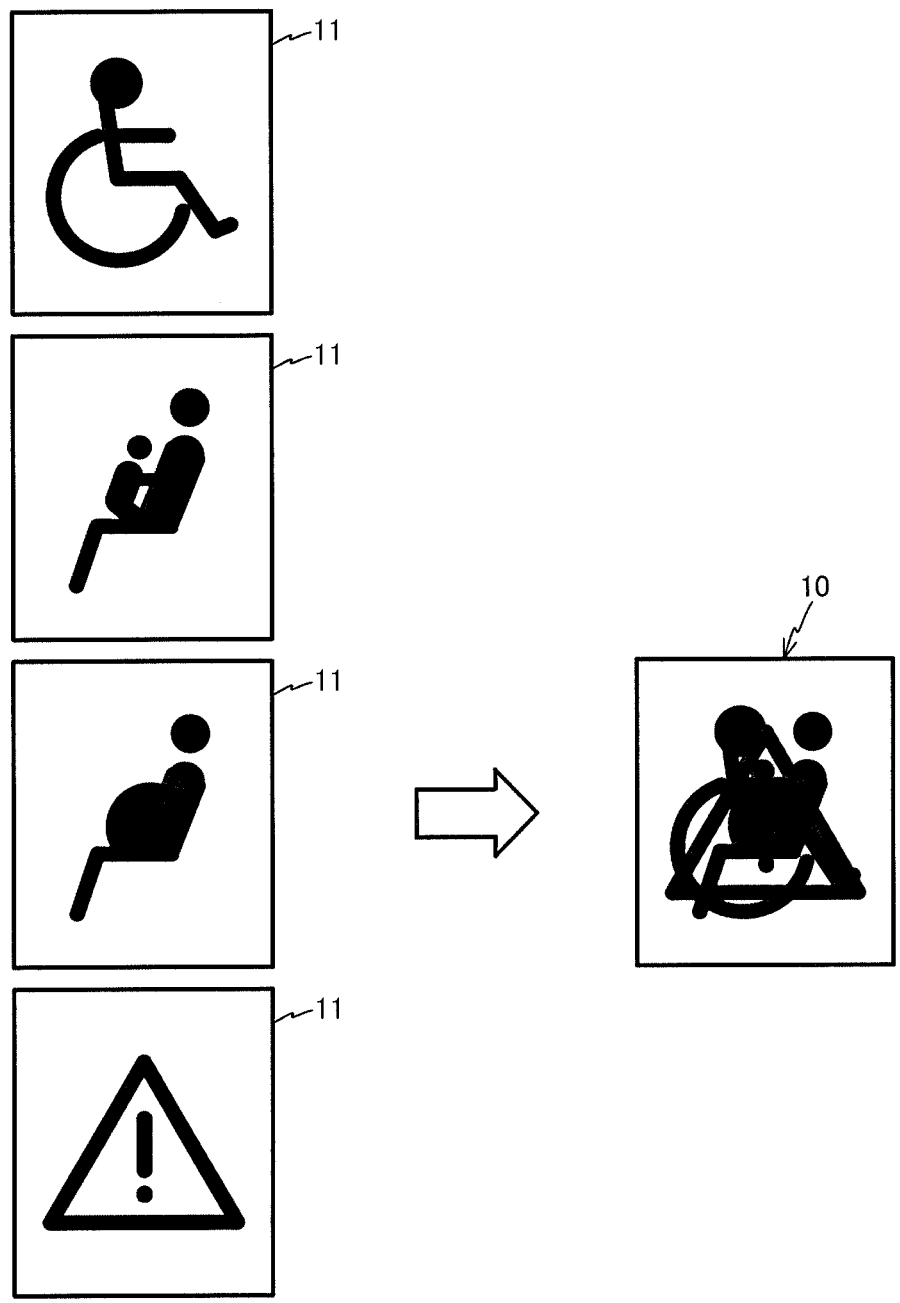
FIG. 21 is a diagram for describing applications of the light emitting panel.

As for example applications of the light emitting panel 10 according to the above embodiment and modified examples, for example, as illustrated in FIG. 21, the display patterns of the four light emitting modules 11 that form the light emitting panel 10 may be applied as a wheelchair mark, a pregnant-female mark, a child mark, a mark prompts an attention, etc. According to this light emitting panel 10, an arbitrary mark can be displayed by selectively driving the four light emitting modules 11.

Although the embodiment of the present disclosure and the modified examples thereof have been described above, the present disclosure is not limited to those. For example, in the above embodiment and the modified examples, as illustrated in FIG. 4, the conductive layer 23 that is formed by the mesh patterns 201 to 210 is formed only on the lower surface of the light transmissive film 21 in the pair of light transmissive films 21, 22. The present disclosure is not limited to this case, and the conductive layer may be formed on the light transmissive film 22. In this case, application of a light emitting element that has electrodes on the upper surface and the lower surface, respectively, is enabled.

In the above embodiment, etc., the conductive layer 23 formed with the connection pads 200P are finely divided by laser light to form the mesh patterns 201 to 210. The present disclosure is not limited to this case, and the mesh patterns 201 to 210 may be formed by photo lithography.

In the above embodiment, etc., the description has been given of an example case in which the resin layer 24 is formed of the thermosetting resin 241 and the thermoplastic resin 242 both in a sheet shape. The present disclosure is not limited to this case, and the thermosetting resin 241 and the thermoplastic resin 242 may be coated on the respective light transmissive films 21, 22, and the resin layer 24 may be formed of these applied thermosetting resin 241 and thermoplastic resin 242.

In the above embodiment, etc., the description has been given of an example case in which the resin layer 24 is formed of the thermosetting resin 241 and the thermoplastic resin 242. The present disclosure is not limited to this case, and the resin layer 24 may be formed of only the thermoplastic resin. Moreover, the resin layer 24 may be formed of only the thermosetting resin.

In the above embodiment, etc., the description has been given of an example case in which the conductive layer 23 formed by the mesh patterns 201 to 210 is formed of a metallic material, such as copper (Cu) or silver (Ag). The present disclosure is not limited to this case, and the conductive layer 23 may be formed of a transparent material with an electrical conductivity like indium tin oxide (ITO). In this case, each of the mesh patterns 201 to 210 illustrated in FIG. 1 is formed of a plane pattern (solid pattern) with a uniform thickness and formed of a transparent conductive film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modified examples as would fall within the scope and spirit of the inventions.

The invention claimed is:

1. A light emitting panel comprising a plurality of light emitting modules that are arranged so as to overlap with each other, the plurality of light emitting modules each comprising:
   a first insulation film that is light transmissive and flexible;

a second insulation film which is disposed so as to face the first insulation film, and which is light transmissive and flexible;

a conductive layer formed on the first insulation film;

a plurality of light emitting elements which is disposed between the first insulation film and the second insulation film, is disposed so as to form a predetermined display pattern, and is connected to a first circuit pattern and a second circuit pattern among a plurality of circuit patterns forming the conductive layer; and a power supply that individually applies a voltage to the plurality of light emitting elements by applying a different voltage to each of the first and second circuit patterns to which the plurality of light emitting elements are connected.

2. The light emitting panel according to claim 1, wherein the pattern formed by the plurality of light emitting elements of the respective light emitting modules are different from each other.

3. The light emitting panel according to claim 1, wherein the pattern formed by the plurality of light emitting elements of the respective light emitting modules are consistent with each other.

4. The light emitting panel according to claim 3, wherein the plurality of light emitting elements of each of the light emitting modules have a same location in the plurality of light emitting modules.

5. The light emitting panel according to claim 4, comprising:

a first light emitting module having a pattern formed by a red light emitting element that emits red light;

a second light emitting module having a pattern formed by a green light emitting element that emits green light; and a third light emitting module having a pattern formed by a blue light emitting element emitting blue light.

6. The light emitting panel according to claim 1, further comprising a power supply that causes the plurality of light emitting elements of the respective light emitting modules to emit light at a different intensity for each light emitting module.

7. The light emitting panel according to claim 1, wherein the plurality of light emitting elements have a different color for each light emitting module.

8. The light emitting panel according to claim 1, wherein the light emitting module comprises the light emitting element that emits red light, the light emitting element that emits green light, and the light emitting element that emits blue light, the light emitting elements being disposed adjacent to each other.

9. The light emitting panel according to claim 1, wherein the pattern is a letter or a mark.

10. The light emitting panel according to claim 1, wherein light transmittance of the first and second insulation films is 5 to 95%.

11. The light emitting panel according to claim 1, wherein bending elastic modulus of the first and second insulation films is 0 to 320 kgf/mm$^2$.

12. The light emitting panel according to claim 1, wherein the conductive layer comprises a plurality of mesh patterns.

13. The light emitting panel according to claim 12, wherein a plurality of pads are formed on each of the plurality of mesh patterns, a pair of electrodes of each of the light emitting elements is connected to one of the pads of the plurality of mesh patterns so that the light emitting elements are connected to the mesh patterns adjacent to each other.

14. The light emitting panel according to claim 1, wherein the plurality of mesh patterns comprise a plurality of line patterns having a line width of about 10 μm.

15. The light emitting panel according to claim 14, wherein an array pitch of the plurality of line patterns is about 300 μm.

16. The light emitting panel according to claim 1, wherein the plurality of light emitting elements include at least two of a red light emitting element that emits red light, a green light emitting element that emits green light, and a blue light emitting element that emits blue light disposed close to each other.

17. The light emitting panel according to claim 1, wherein the plurality of circuit patterns are provided from one side of the first insulation film to the other side, and are adjacent to each other in a state of being parallel to each other, the plurality of light emitting elements are connected to two adjacent first and second circuit patterns respectively.

18. The light emitting panel according to claim 17, wherein the plurality of circuit patterns are arranged at equal intervals via a predetermined clearance.

19. The light emitting panel according to claim 17, wherein the power source is provided on one side of the first insulation film.

20. The light emitting panel according to claim 17, wherein the power supply is provided for each of the light emitting modules.

* * * * *